United States Patent [19]

Hansell et al.

[11] Patent Number: 4,633,284
[45] Date of Patent: * Dec. 30, 1986

[54] THIN FILM TRANSISTOR HAVING AN ANNEALED GATE OXIDE AND METHOD OF MAKING SAME

[75] Inventors: Gregory L. Hansell, Ann Arbor, Mich.; Zvi Yaniv, Beer-Sheva, Israel; Vincent D. Cannella, Detroit, Mich.

[73] Assignee: Energy Conversion Devices, Inc., Troy, Mich.

[*] Notice: The portion of the term of this patent subsequent to Oct. 15, 2002 has been disclaimed.

[21] Appl. No.: 549,979

[22] Filed: Nov. 8, 1983

[51] Int. Cl.$^4$ .............................................. H01L 29/78
[52] U.S. Cl. ........................................ 357/23.7; 357/2; 357/4
[58] Field of Search ................... 357/23.7, 2, 4, 55, 357/23.1, 23.15, 23.4

[56] References Cited

U.S. PATENT DOCUMENTS 3,191,061  6/1965  Weimer ................................... 357/4
3,669,661  6/1972  Page et al. ............................ 430/313

FOREIGN PATENT DOCUMENTS 2052853  1/1981  United Kingdom .............. 357/23.7
2067353  7/1981  United Kingdom .............. 357/23.7

OTHER PUBLICATIONS

IBM Technical Disclosure Bulletin, vol. 11, #3, Aug. 1968, "High Speed FET" by Drangeid, p. 332.

Primary Examiner—Martin H. Edlow
Assistant Examiner—Mark Prenty
Attorney, Agent, or Firm—Lawrence G. Norris; Robert S. Nolan; Richard O. Gray, Jr.

[57] ABSTRACT

A new and improved thin film field effect transistor and method provides such a transistor having increased operating frequencies and higher output currents. The transistor includes a gate electrode having a non-coplanar surface with respect to the substrate and a deposited semiconductor material overlying the gate electrode to form a current conductor channel between a source and drain. The length of the current conduction channel is determined by the thickness of the gate electrode which can be accurately controlled. As a result, short channel lengths are possible without high precision photolithography for high output currents and fast operating speeds. Further, a gate insulator is disposed between the gate and the deposited semiconductor. The gate insulator, which can be a gate oxide, can be annealed prior to the deposition of the deposited semiconductor to provide enhanced field effect mobilities. This further increases the transistor output currents and operating speeds.

18 Claims, 10 Drawing Figures

THIN FILM TRANSISTOR HAVING AN ANNEALED GATE OXIDE AND METHOD OF MAKING SAME

BACKGROUND OF THE INVENTION

1. FIELD OF THE INVENTION

The present invention relates to high performance thin film field effect transistors. The transistors include a gate electrode having a non-coplanar surface with respect to a substrate and a deposited semiconductor material overlying the gate electrode forming a short current conduction channel between a source and drain. The deposited semiconductor is electrically insulated from the gate electrode by an insulating oxide which can be annealed prior to the deposition of the semiconductor material.

2. DESCRIPTION OF THE PRIOR ART

Thin film field effect transistors generally comprise source and drain electrodes interconnected by a semiconductor material. Conduction between the electrodes takes place primarily within the semiconductor. The current flow between the electrodes is controlled by the application of a voltage to a gate which is adjacent at least a portion of the semiconductor and is insulated therefrom.

There are many applications wherein it is desirable to have a thin film field effect transistor capable of providing relatively high output currents and operating at relatively high speeds. One such application is in large area liquid crystal displays wherein the transistors are called upon to drive the individual pixels of the displays. The current required to drive these displays is directly related to the display area while the required device speed is directly related to the number of pixels forming the display.

In the film field effect transistors, the device output curren operating speed are largely dependent upon the length of e current conduction channel between the source and drain. Mo particularly, the output current is inversely proportional the channel length and the operating frequency is inversely proportional to the square of the channel length. Hence, if the annel length of a device can be reduced from 10 microns to 1 micron, the output current could be increased ten times and the ating speed could be increased one hundred times. In addition, if the channel length could be decreased as above, the the of the device could be decreased. For example, typical planar thin film field effect transistors have a channel length of 10 microns, a width of about 500 microns and provide current of about 10 microamps. If the channel lengt that device could be reduced to one micron, that same 10 microamps of current could be provided by a device only 50 microns wide. Hence, the total area of the device could be by a factor of ten and thus the packing density could increased by a factor of ten. By reducing the device area by one-tenth, the capacitance of the device can also be reduceo by a factor of ten. Further, the resulting device, while providing the same current and occupying one-tenth the area, could also exhibit an operating frequency one hundred times higher than the original thin film field effect transistors having the ten micron channel.

Unfortunately, the channel length in conventional thin film field effect transistors cannot be readily reduced from the standard channel length of ten microns to a channel length of one micron. The reason for this is that the channel length is determined the spacing between the drain and source electrodes. conventional large area photolithography, the process by which the device structures are formed across twelve inch distances, has a feature size of ten microns. Hence, with conventional photolithography as used for large areas, the minumum channel length obtainable is ten microns.

More precise photolithography having feature sizes down to about one micron are known. However, this precision process is difficult to perform and the equipment necessary to practice it is extremely expensive. In addition, the one micron feature size cannot be maintained over large areas. As a result, while channel lengths in conventional thin film field effect transistors can be reduced to about one micron in the laboratory, it is expensive and cannot be provided over large areas such as is required in large area liquid crystal flat panel displays. This makes precision photolithography virtually useless in commercial applications such as liquid crystal flat panel display where one hundred percent yield over large areas is essential.

To overcome these deficiencies in prior art thin film field effect transistor structures, a new and improved thin film field effect transistor has heen proposed. This improved transistor is disclosed and claimed in commonly assigned and now abandoned copending U.S. application Ser. No. 529,299 for Thin Film Transistor filed in the names of Richard A. Flasck, et al. The transistor therein disclosed includes source and drain regions vertically displaced with respect to each other relative to a substrate and having a channel formed therebetween, the length of which is a function of the vertical displacement distance between the source and drain and which is substantially independent of the constraints otherwise imposed by horizontal lithography.

Further improvement in this transistor is disclosed and claimed in copending U.S. application Ser. No. 549,996, filed concurrently herewith, for High Performance, Small Area, Thin Film Transistor which is assigned to the assignee of the instant invention. The transistor there disclosed includes a drain region, a source region, a gate electrode, a gate insulator, and a deposited semiconductor material. The drain and source region are vertically arrayed with respect to a substrate, have an insulating layer therebetween, and form a non-coplanar surface with respect to the substrate. As defined in that application, a non-coplanar surface is meant to be a surface which defines a plane which is non-parallel with respect to the substrate although it may include minor surface portions which are parallel to the substrate. The deposited semiconductor material which is preferably an amorphou silicon alloy overlies the non-coplanar surface to form a current conduction channel or path between the drain and source regions. The gate electrode insulator overlies the deposited semiconductor and the gate electrode overlies at least a portion of the gate insulator adjacent to the current conduction channel.

These transistor structures exhibit many advantages. Because the thickness of the layer between the source and drain determines the current conduction channel length through the semiconductor, the channel length can be accurately controlled without precision and time consuming photolithography techniques. As a result, short channel lengths are possible providing high current and high speed operation of the device. Further, the accurate control of the short channel lengths can be maintained over large areas for applications such as liquid crystal displays where high yield is essential and where high precision photolithography fails.

While the transistors described above have many advantages, a further improvement thereto is disclosed and claimed in copending U.S. Application Ser. No. 550,234, filed concurrently herewith for High Performance Thin Film Transistor Having Improved Ohmic Contacts and which is assigned to the assignee of the present invention. As described in that application, the drain and source regions are each formed from a layer of a metal, such as molybdenum for example, and a doped semiconductor layer. The doped semiconductor layer provides an enhanced carrier injection and ohmic contact between the deposited semiconductor and the source and drain regions so that higher currents from the device can be obtained for a given source to drain voltage. The enhanced carrier injection and ohmic contacts allow the advantages afforded by the device structure to be fully realized.

The present invention provides a further improvement to these devices. More specifically, the present invention provides a new thin film transistor structure and method of making same wherein the gate oxide can be annealed prior to the deposition of the deposited semiconductor. This is a distinct and significant advantage since annealed oxides exhibit less leakage and fixed charge than oxides which are not annealed. Annealed gate oxides have not been possible in the prior art because the temperature required to effect sufficient annealing would adversely affect the electrical properties of the deposited semiconductor. By virtue of the annealed gate oxide, higher device field mobilities are obtained which increases both the operating frequencies and oulpul current of the devices.

SUMMARY OF THE INVENTION

The present invention provides a thin film field effect transistor and method of making same wherein the transistor includes a substrate, a gate electrode formed of conductive material on the substrate, a deposited semiconductor material overlying the gate electrode, an insulative material electrically insulating the semiconductor material from the gate electrode and means forming a source and drain spaced apart from each other and in electrical connection with the deposited semiconductor preferably on respective opposite sides of the gate electrode. The insulating layer can be annealed prior to the deposition of the semiconductor material and the gate electrode can be formed to include a non-coplanar surface with respect to the substrate so that the current conduction channel length within the semiconductor channel can be determined by the effective thickness of the gate electrode.

Further, the gate and drain can be formed on respective opposite sides of the non-coplanar surface by depositing the source and drain using collimated beam deposition at an angle to the substrate and by using the non-coplanar surface as a shadow mask during the deposition.

BRIEF DESCRIPTION OF THE DRAWINGS

The features of the present invention which are believed to be novel are set forth with particularity in the appended claims. The invention, together with further objects and advantages thereof, may best be understood by making reference to the following description taken in conjuction with the accompanying drawings, in the several figures of which like reference numbers identify identical elements and wherein:

DESCRIPTION OF THE PREFERRED EMBODIMENTS

Figure 1:
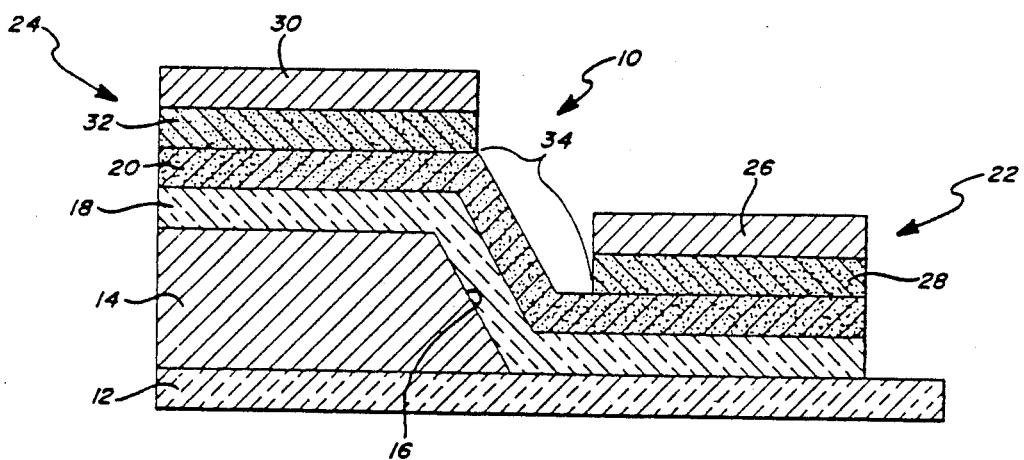
FIG. 1 is a cross-sectional side view of a thin film, field effect transistor embodying the present invention.

Referring now to FIG. 1, it illustrates a thin film field effect transistor 10 made in accordance with the present invention. As shown, the transistor 10 is formed on a substrate 12 of insulating material which could be glass, single crystalline silicon, mylar, or an insulator on top of a metal. Deposited on the substrate 12 is a gate layer 14 of conductive metal. The gate electrode 14 is relatively thick in dimension about one micron, for example, and includes a non-coplanar or non-horizontal surface 16 with respect to the substrate 12. A non-coplanar surface is meant to be a surface which defines a plane which is non-parallel to the substrate although it may include minor surface portions which are parallel to the substrate.

On top of the gate electrode 14 is an insulating material 18. The layer of insulating material can be annealed prior to subsequent processing and be formed from silicon oxide ($SiO_x$), silicon nitride ($Si_xN_y$), or silicon oxy-nitride ($SiO_xN_y$).

Deposited over the gate insulator 18 is a deposited semiconductor material 20. The semiconductor 20 is between 100 and 10,000 Å in thickness and preferably about 2,000 Å. It is conformal to the non-coplanar surface 16 and is preferably formed from an amorphous silicon alloy including hydrogen, or fluorine, or hydrogen and fluorine. The deposited semiconductor material can also be a polycrystalline silicon alloy or a germanium alloy.

The transistor 10 further includes a drain 22 and a source 24 which are disposed on respective opposite sides of the gate electrode 14 and more particulary on respective opposite sides of the non-coplanar surface 16. The drain 22 includes a drain metal 26 and a doped semiconductor deposit 28 which provides a good ohmic contact between the drain metal 26 and the deposited semiconductor 20. Similarly, the source 24 includes a source metal 30 and another deposit 32 of doped semiconductor material. The drain metal can be, for example, aluminum or chromium and the doped semiconductor deposits 28 and 32 are preferably an n-type amorphous silicon alloy including fluorine.

The source metal 30 and the drain metal 26 can have thicknesses ranging from 1,000 to 3,000 Å, with the thickness preferably being 2,500 Å. The gate layer 14 can have a thickness between 0.5 to 3 microns, preferably about 1 micron, and the gate insulator layer 18 can have a thickness of between 300 to 5,000 Å, and preferably 2,000 Å.

In constructing the thin film, field effect transistor 10 shown in FIG. 1, the layers of material can be deposited by various deposition techniques, such as sputtering and plasma assisted chemical vapor deposition. The non-coplanar surface 16 can be formed by a dry etch process or a wet etch process. The process will be explained subsequently in greater detail.

As can be noted in FIG. 1, the semiconductor material 20 forms a current conduction channel 34 between the drain 22 and the source 24. The major portion of the length of the channel includes the portion of the semiconductor which overlies the non-coplanar surface 16. As a result, the length of the current conduction channel is largely determined by the thickness of the gate electrode 14. Because the thickness of the gate electrode 14 can be accurately controlled to thicknesses down to about 0.5 microns, for example, short current conduction channels are made possible without precision photolithography techniques. Also, because the gate oxide 18 can be annnealed prior to the deposition of the deposited semiconductor 20, less leakage current and fixed space charge will result in the gate oxide 18. This therefore provides a transistor having higher field effect mobilities. Since the operating frequency and output current of a field effect transistor are directly proportional to the field effect mobility, the transistor of the present invention can provide higher operating frequencies and output currents.

Figure 2:
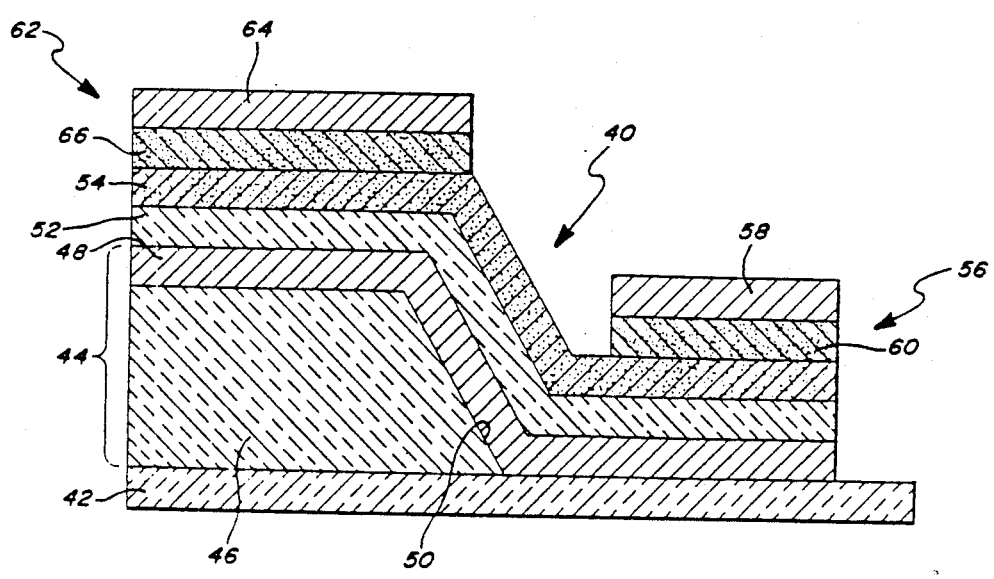
FIG. 2 is a cross-sectional side view of another thin film, field effect transistor embodying the present invention.

Referring now to FIG. 2, it illustrates another thin film field effect transistor 40 embodying the present invention. The transistor 40 is formed on an insulative substrate 42 such as glass, for example. The transistor 40 includes a gate 44 which is a composite structure comprising a deposit 46 of an insulative material and a layer of gate metal 48 overlying the insulative deposit 46. The insulative deposit 46 can be formed from an oxide, such as silicon oxide ($SiO_x$), and deposited by plasma assisted chemical vapor deposition. The gate metal layer 48 can be formed from molybdenum, aluminum, chromium, or a molybdenum tantalum alloy.

As can be noted in FIG. 2, the insulative deposit 46 includes a non-coplanar surface 50 with respect to the substrate. The non-coplanar surface 50 can be formed by a dry etch or wet etch process which will be referred to subsequently in greater detail.

Like the gate electrode 14 of FIG. 1, the gate structure 44 has a thickness of about 0.5 to 3 microns, and preferably about one micron. This can be obtained by depositing the insulative deposit 46 to a thickness of about 0.8 microns, and the gate metal layer 48 to a thickness of about 0.2 micron. With these dimensions, a short current conduction channel of about one micron can be obtained.

The transistor 40 also includes a gate insulating layer 52. This layer can be formed of silicon oxide ($SiO_x$), silicon nitride ($Si_xN_y$), or silioxynitride ($SiO_xN_y$), for example. Like the gate oxide of transistor 10 of FIG. 1, because the oxide layer 52 is formed prior to the deposition of the deposited semiconductor which forms the current conduction channel, the gate oxide can be annealed before the semiconductor is deposited. Therefore, like the transistor 10 of FIG. 1, enhanced field effect mobilities can be obtained resulting in increased output currents and higher operating frequencies.

Deposited over the gate insulator 52 is the deposited semiconductor 54. It can be formed as previously described, and again, is preferably an amorphous silicon alloy having a thickness between 100 and 10,000 Å and preferably 2,000 Å, for example.

The transistor 40 further includes a drain 56 including a drain metal 58 and a deposit of doped semiconductor 60, such as an n-type amorphous silicon alloy. Lastly, the transistor 40 includes a source 62. Similarly, the source 62 includes a source metal 64 and a deposit 66 of doped semiconductor, such as, in n-type amorphous silicon alloy. As in the previous embodiment, the doped semiconductors 60 and 66 provide an enhanced ohmic contact between the deposited semiconductor 54 and the drain metal 58 and source metal 64 respectively, which can be formed from aluminum or chromium, for example.

Referring now to FIGS. 3A through 3H, these figures illustrate a method embodying the present invention which can be utilized in making the transistor 10 of FIG. 1. The method is also applicable to the transistor 40 of FIG. 3 with only slight modification which will be explained herein.

Figure 3A:
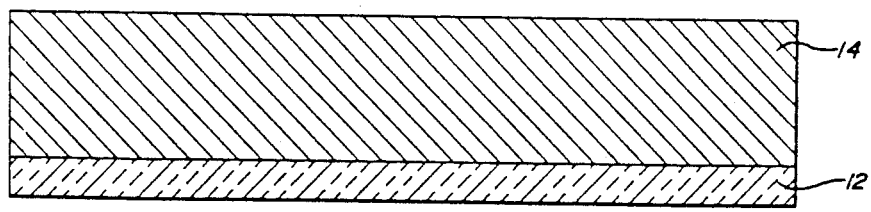
FIGS. 3A-3H are a series of cross-sectional side views illustrating a method of making the thin film field effect transistor illustrated in FIG. 1 in accordance with the present invention.

As shown in FIG. 3A, a relatively thick layer of gate metal 14 is formed on the substrate 12. The layer, as previously described can be from about 0.5 microns to 3 microns in thickness, and preferably about one micron. It can be deposited by a high speed process such as D.C. magnetron sputtering, for example.

Figure 3B:
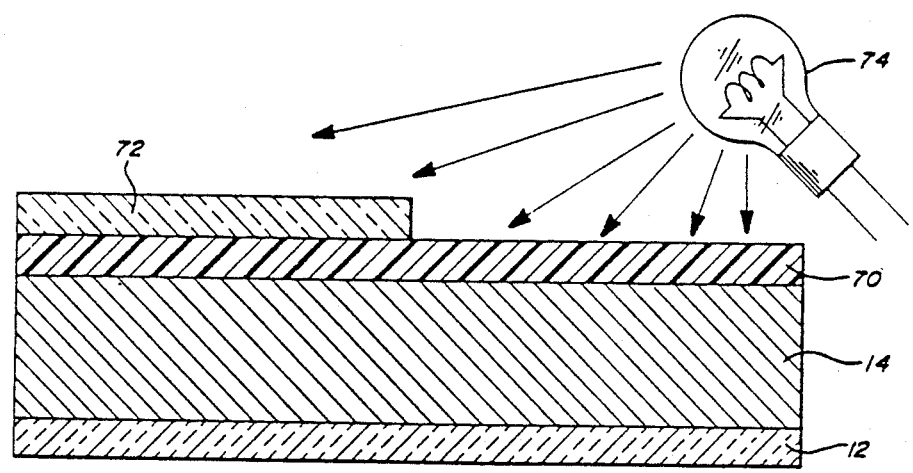
Figure 3C:
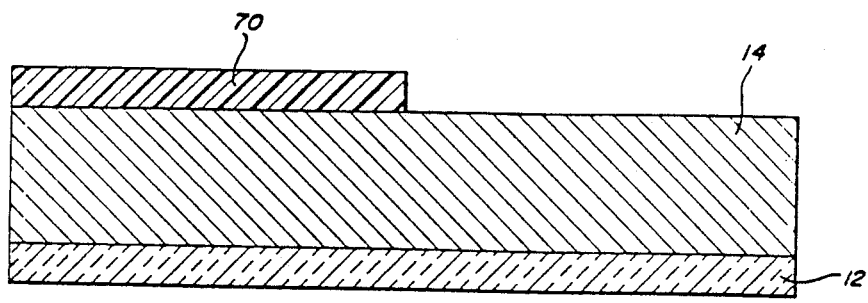
Figure 3D:
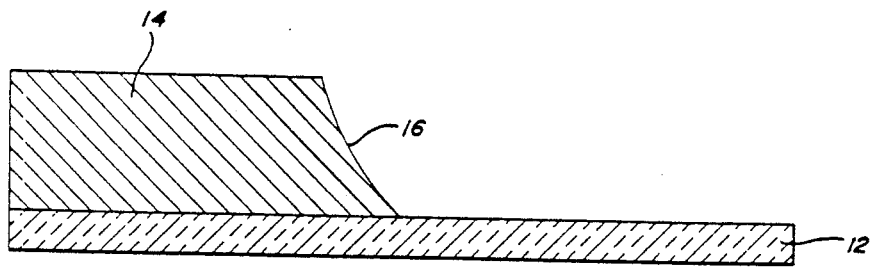

After the gate metal layer 14 is formed on substrate 12, a layer of a photoresist 70, such as a positive photoresist is applied over the gate metal 14 as shown in FIG. 3B. A mask 72 is then placed over a portion of the photoresist 70 and the uncovered photoresist portion is exposed by a collimated light source 74 perpendicular to the substrate 12. The mask is then removed and the photoresist is developed leaving the structure illustrated in FIG. 3C. The foregoing can be performed by using conventional ten micron lithography. As can be noted, the unexposed portion of the photoresist 70 remains over the gate metal 14. The gate metal is then wet etched. Because of the undercutting that occurrs in this type of process, the non-coplanar surface 16 is formed as shown in FIG. 3D. Suitable gate metals for this wet etch process include molybdenum, chromium, aluminum, or a molybdenum tantalum alloy.

Alternatively, the non-coplanar surface 16 can be formed by a dry etch process as fully disclosed and claimed in copending U.S. application Ser. No. 549,991, filed concurrently herewith for Method Of Making A High Performance, Small Area Thin Film Transistor and now abandoned. As described in that application, the layer of positive photoresist 70 can have a thickness of about 3 to 3.5 microns. It can be deposited by using a spin coating method and the positive photoresist is, for example, Shipley's p-type AZ 1350J. The mask 72 can then be placed over a portion of the positive photoresist layer 70. The unmasked portion of layer 70 is then exposed to the light source 74 having an intensity of 300 millijoules/cm$^2$ for a period of 16 seconds so that it is underexposed by about 20% since the normal intensity of exposure is 360 millijoules/cm$^2$ for 16 seconds.

After exposure, the mask 72 is removed and the positive photoresist layer 70 is actively developed. For example, one part of Shipley developer AZ-311 is used along with three parts water to create an active developer solution. Only the exposed portions of the positive photoresist layer 70 are soluble to the active developer solution.

After developing the positive photoresist layer 70, a tapered surface results on a portion of the photoresist. The tapered surface serves as a mask when the gate metal 14 is subjected to a plasma etching process. FIG. 3D illustrates the structure that results after plasma etching except that the non-coplanar surface 16, instead of being slightly arcuate as illustrated after wet etching, will be more planar in configuration as shown in FIGS.

1 and 2. Suitable gate metals which can be used for this plasma etch process include molybdenum or a molybdenum tantalum alloy, for example.

To form the non-coplanar surface 50 of transistor 40 as shown in FIG. 2, the insulative layer 46 is first deposited onto the substrate 42. After the layer 46 is formed, it can be subjected to the same wet or dry etch processing as described immediately above for the gate metal layer 14. After the non-coplanar surface is formed, the gate metal 48 is deposited to complete the formation of the gate. All further processing for the transistor 40 of FIG. 2 can then be identical to the further process steps described hereafter.

Figure 3E:
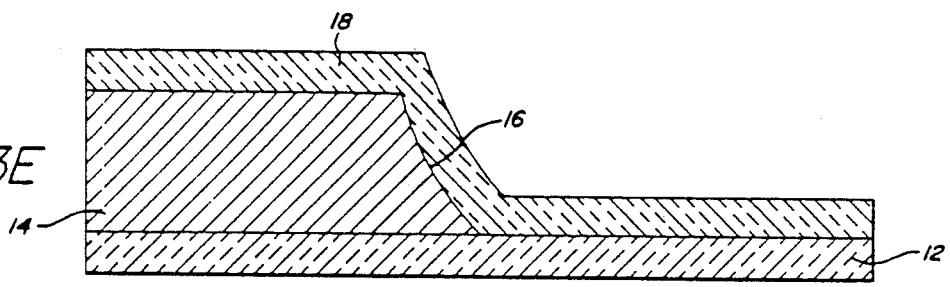

Referring now to FIG. 3E, after the gate electrode is formed, including the non-coplanar surface 16, the gate insulator 18 is then deposited over the gate electrode. The gate insulator is preferably silicon oxide ($SiO_x$) and deposited by plasma assisted chemical vapor deposition, also commonly referred to as glow discharge decomposition deposition. The gate oxide 18 is then annealed. It should be noted that this annealing is possible without adversely effecting any of the transistor elements already formed on the substrate 12. The gate oxide 18 can be annealed at temperatures between about 400° C. and the melting point of the gate metal. Preferably, the gate oxide is annealed at about 600° C. for a period of about one hour.

Figure 3F:
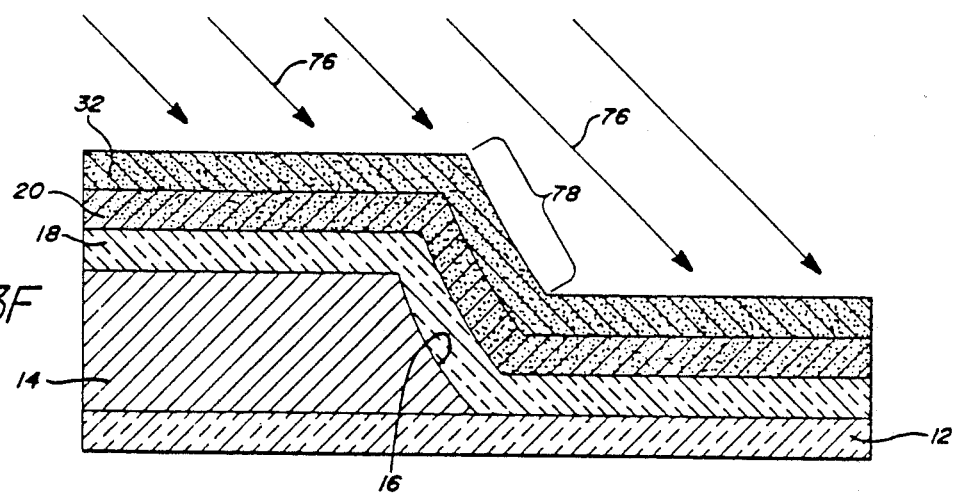

As shown in FIG. 3F, after the gate oxide 18 is annealed, the semiconductor material 20 and doped semiconductor 32 are deposited in succession over the gate oxide 18. These layers can also be deposited by plasma assisted chemical vapor deposition. As previously mentioned, the deposited semiconductor 20 is preferably an amorphous silicon alloy and for the type of transistor shown the doped semiconductor is preferably an n-type amorphous silicon alloy including fluorine.

Figure 3G:
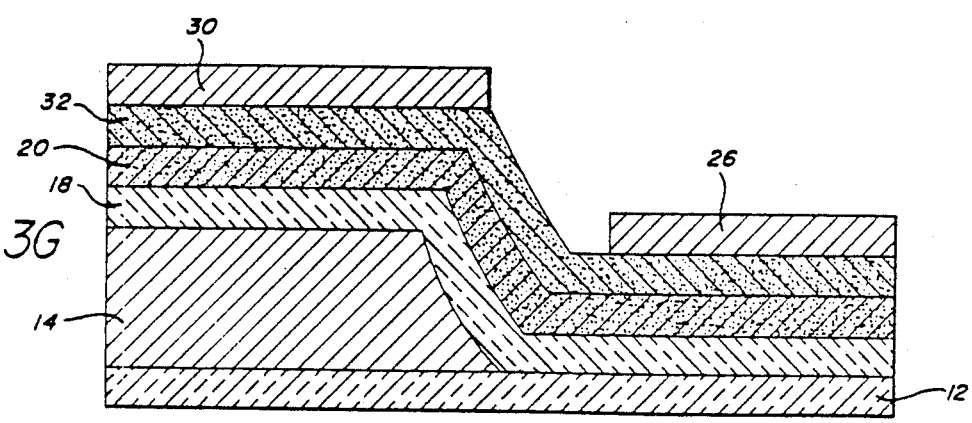

After the semiconductor layers 20 and 32 are deposited, the source and drain metals are deposited. Here, a process herein referred to as collimated beam deposition is utilized. The deposition is performed at an angle to the substrate 12 as indicated by the arrows 76 which denote the incident metal vapor deposition beam. Processes such as ion beam sputtering or electron beam evaporation are suitable for this process. As can be noted in FIG. 3F, because the layers 18, 20, and 32 are conformal to the non-coplanar surface 16, the area 78 parallel to the non-coplanar surface 16 will not receive any deposit. In essence, the non-coplanar surface acts as a shadow mask so that only the area of the doped semiconductor layer 32 on opposite sides of the gate electrode, and more particularly on opposite sides of the non-coplanar surface 16, will receive the source and drain metal deposit. FIG. 3G illustrates the resulting structure formed after the collimated beam deposition.

Figure 3H:
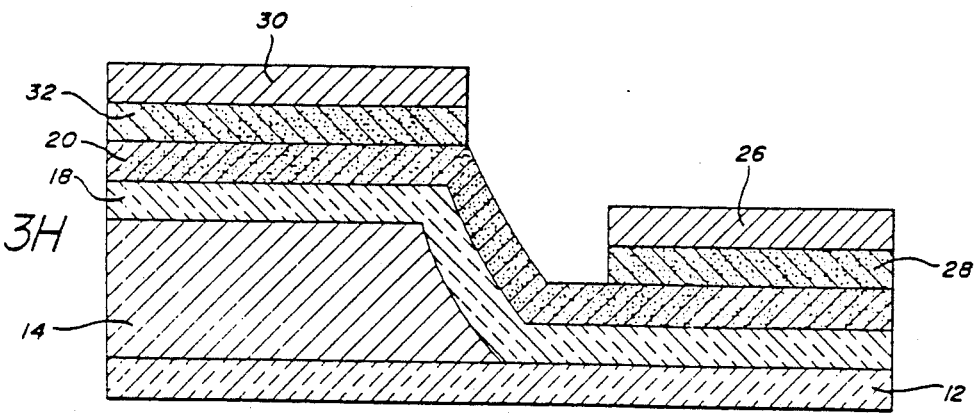

To complete the device, the doped semiconductor layer 32 is etched using the source metal 30 and drain metal 26 as a mask. This can be either a dry etch, i.e., a plasma etch, or a wet etch process. Once the doped semiconductor is removed, the finished device illustrated in FIG. 3H is formed with the doped semiconductor 32 and 28 being disposed between the deposited semiconductor 20 and the source metal 30 and drain metal 26 respectively.

What is claimed is:

1. A thin film field effect transistor formed on a substantially planar surface, said transistor comprising:
   a gate electrode formed on at least a portion of said substantially planar surface, said gate electrode including a surface portion which is non-parallel to said planar surface;
   a pair of lateral surface portion adjacent said non-parallel surface portion and extending in respective opposite directions from said non-parallel surface portion;
   a layer of insulating material overlying said non-parallel surface portion of said gate electrode and extending laterally therefrom in opposite directions;
   a semiconductor material overlying at least that portion of said layer of insulating material overlying the non-parallel surface portion of the gate electrode; and
   a source electrode overlying a respective one of said lateral surface portions and a drain electrode overlying the other said lateral surface portion, said drain and source electrodes being in electrical connection with said semiconductor material.

2. A thin film field effect transistor as defined in claim 1 wherein said semiconductor material forms a current conduction channel between said source and drain having a length determined by the effective thickness of said gate electrode.

3. A thin film field effect transistor as defined in claim 1 wherein said gate electrode comprises a single layer of conductive material.

4. A thin film field effect transistor as defined in claim 3 wherein said conductive material is a metal.

5. A thin film field effect transistor as defined in claim 4 wherein said metal is aluminum, chromium, molybdenum or a molybdenum tantalum alloy.

6. A thin film field effect transistor as defined in claim 1 wherein said gate electrode comprises a second layer of insulating material and a layer of conductive material overlying said second layer of insulating material.

7. A thin film field effect transistor as defined in claim 6 wherein said conductive material is a metal.

8. A thin film field effect transistor as defined in claim 7 wherein said metal is aluminum, chromium, molybdenum or a molybdenum tantalum alloy.

9. A thin film field effect transistor as defined in claim 6 wherein said second layer of insulating material is formed from silicon oxide ($SiO_x$).

10. A thin film field effect transistor as defined in claim 1 wherein said insulating material comprises silicon oxide ($SiO_x$).

11. A thin film field effect transistor as defined in claim 1 wherein said source electrode and drain electrode each comprises a metal.

12. A thin film field effect transistor as defined in claim 11 wherein said source electrode and drain electrode further include a first layer of a doped semiconductor between said source metal and said semiconductor material and a second layer of a doped semiconductor between said drain metal and said deposited semiconductor material.

13. A thin film field effect transistor as defined in claim 1 wherein said non-parallel surface portion of said gate electrode comprises a diagonal surface with respect to said planar surface.

14. A thin film field effect transistor as defined in claim 1 wherein said semiconductor material includes silicon or germanium.

15. A thin film field effect transistor as defined in claim 2 wherein said length of said current conduction channel is substantially determined by the length of said non-parallel surface portion of said gate electrode.

16. A thin film field effect transistor as defined in claim 1 wherein said semiconductor material is an amorphous alloy of silicon including hydrogen or fluorine.

17. A thin film field effect transistor as defined in claim 13 wherein said semiconductor material is an amorphous alloy of silicon including hydrogen or fluorine.

18. A thin film field effect transistor as defined in claim 13 wherein said semiconductor material is a polycrystalline silicon alloy.

* * * * *